United States Patent
Chen et al.

(10) Patent No.: US 7,223,982 B1
(45) Date of Patent: May 29, 2007

(54) SEGMENTED RADIATION DETECTOR WITH SIDE SHIELDING CATHODE

(75) Inventors: Henry Chen, Victoria (CA); Salah Awadalla, Victoria (CA)

(73) Assignee: Redlen Technologies, Sidney, British Columbia (CA)

(*) Notice: Subject to any disclaimer, the term of this patent is extended or adjusted under 35 U.S.C. 154(b) by 0 days.

(21) Appl. No.: 11/527,707

(22) Filed: Sep. 27, 2006

(30) Foreign Application Priority Data

Feb. 22, 2006 (CA) ................................. 2541256

(51) Int. Cl.
*G01T 1/24* (2006.01)
(52) U.S. Cl. .......................... 250/370.13; 250/370.01
(58) Field of Classification Search .......... 250/370.01, 250/370.08, 370.09, 370.13, 239; 257/448, 257/E27.146
See application file for complete search history.

(56) References Cited

U.S. PATENT DOCUMENTS

| | | | | |
|---|---|---|---|---|
| 5,677,539 A * | 10/1997 | Apotovsky et al. | .... | 250/370.13 |
| 5,905,264 A * | 5/1999 | Shahar et al. | .......... | 250/370.01 |
| 6,034,373 A * | 3/2000 | Shahar et al. | .......... | 250/370.01 |
| 6,037,595 A * | 3/2000 | Lingren | .................. | 250/370.01 |
| 6,069,360 A * | 5/2000 | Lund | ...................... | 250/370.01 |
| 6,175,120 B1 * | 1/2001 | McGregor et al. | ..... | 250/370.13 |
| 6,333,504 B1 * | 12/2001 | Lingren et al. | ........ | 250/370.01 |
| 6,765,213 B2 * | 7/2004 | Shahar et al. | .......... | 250/370.09 |
| 6,781,132 B2 * | 8/2004 | McGregor | ............. | 250/370.09 |
| 7,038,288 B2 * | 5/2006 | Lai et al. | ..................... | 257/448 |
| 2001/0035497 A1 * | 11/2001 | Montemont et al. | ... | 250/370.01 |
| 2002/0066531 A1 * | 6/2002 | Ke et al. | ................. | 156/345.1 |
| 2002/0182716 A1 * | 12/2002 | Weisbuch et al. | ........ | 435/287.2 |

FOREIGN PATENT DOCUMENTS

EP 1 156 347 A1 11/2001

* cited by examiner

*Primary Examiner*—David Porta
*Assistant Examiner*—Faye Boosalis
(74) *Attorney, Agent, or Firm*—Foley & Lardner LLP

(57) ABSTRACT

A semiconductor radiation detector is provided for improved performance of pixels at the outer region of the crystal tile. The detector includes a semiconductor single crystal substrate with two major planar opposing surfaces separated by a substrate thickness. A cathode electrode covers one of the major surfaces extending around the sides of the substrate a fraction of the substrate thickness and insulated on the side portions by an insulating encapsulant. An exemplary example is given using Cadmium Zinc Telluride semiconductor, gold electrodes, and Humiseal encapsulant, with the side portions of the cathode extending approximately 40-60 percent of the substrate thickness. The example with CZT allows use of monolithic CZT detectors in X-ray and Gamma-ray applications at high bias voltage. The shielding electrode design is demonstrated to significantly improve gamma radiation detection of outer pixels of the array, including energy resolution and photopeak counting efficiency. The detector has performance of detector leakage current density less than 6 nA/mm$^2$ at a bias potential of substantially 1400V, and responsive to gamma radiation such that the energy resolution full width half maximum of more than 90% of the pixels is less than 6%.

28 Claims, 14 Drawing Sheets

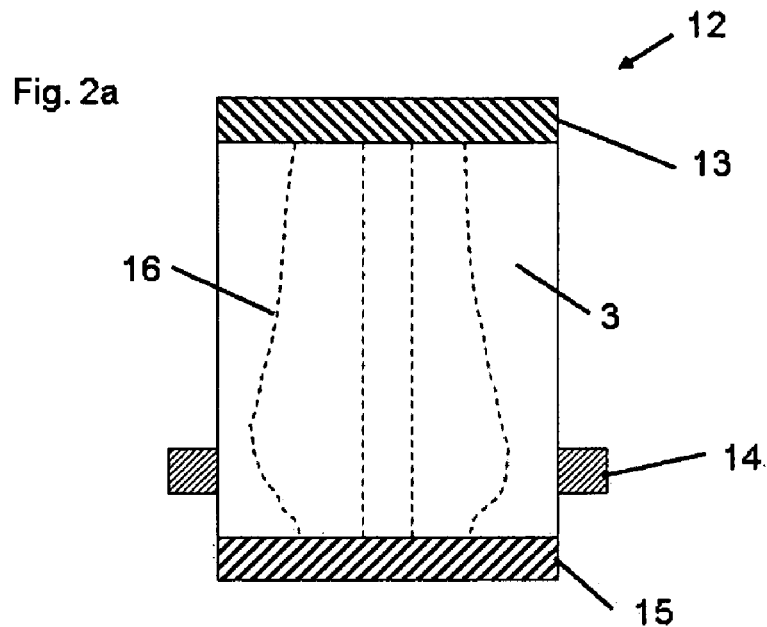
Fig. 2a
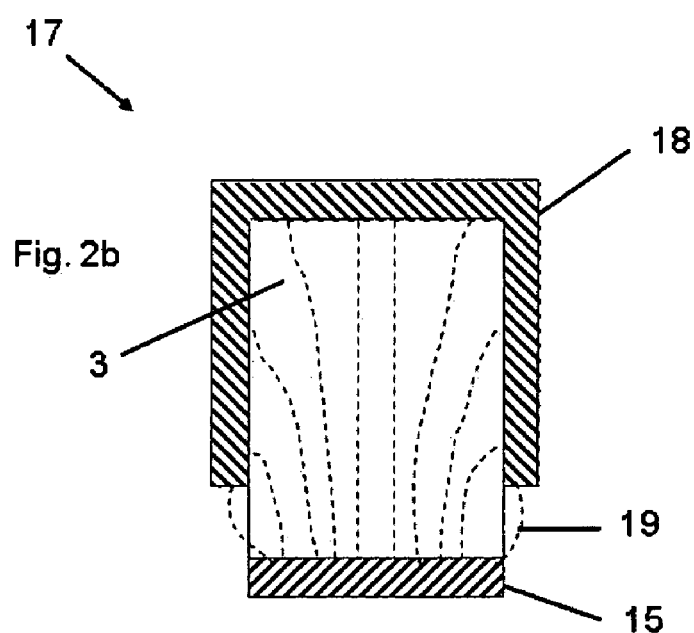
Fig. 2b
Fig. 2

Fig. 12B
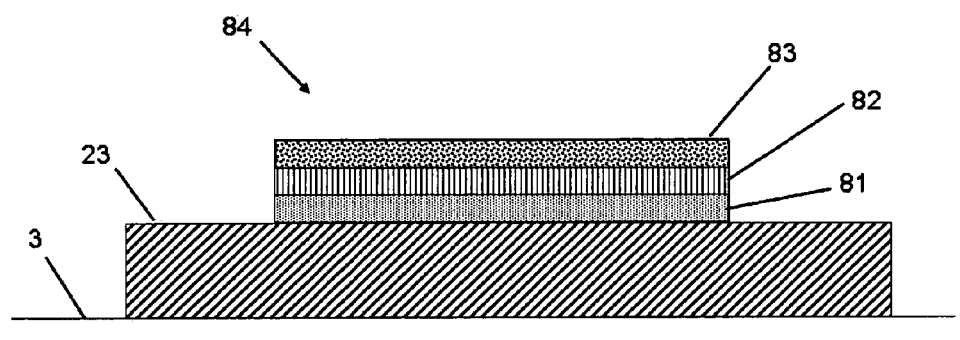
View - Section G
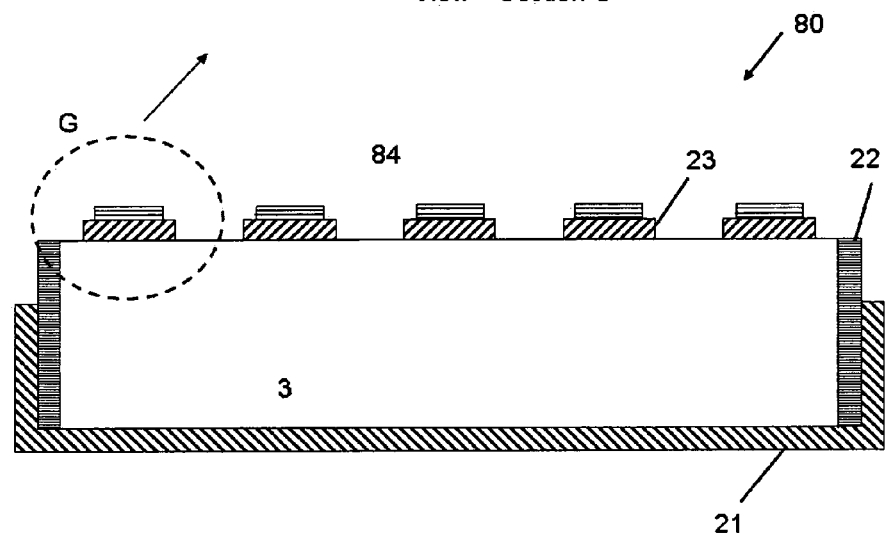
Fig. 12A

| Detector | | Peak Count | | # of Pix with FWHM < 6% | | |
|---|---|---|---|---|---|---|
| | | Edge | 2nd Edge | Edge | 2nd Edge | All |
| A | No Shield | 240 | 338 | 0 | 0 | 0 |
| | With Shield | 273 | 360 | 14 | 2 | 17 |
| B | No Shield | 267 | 328 | 0 | 2 | 4 |
| | With Shield | 312 | 337 | 14 | 3 | 22 |
| C | No Shield | 349 | 387 | 0 | 5 | 12 |
| | With Shield | 343 | 430 | 22 | 10 | 39 |
| D | No Shield | 384 | 514 | 15 | 17 | 47 |
| | With Shield | 429 | 524 | 25 | 18 | 59 |
| E | No Shield | 273 | 318 | 1 | 1 | 2 |
| | With Shield | 330 | 341 | 16 | 3 | 19 |
| F | No Shield | 349 | 412 | 0 | 0 | 4 |
| | With Shield | 395 | 430 | 24 | 2 | 31 |
| G | No Shield | 273 | 361 | 0 | 2 | 2 |
| | With Shield | 348 | 411 | 20 | 8 | 38 |
| H | No Shield | 271 | 549 | 0 | 5 | 9 |
| | With Shield | 394 | 464 | 20 | 6 | 33 |
| I | No Shield | 392 | 440 | 17 | 14 | 45 |
| | With Shield | 441 | 519 | 23 | 19 | 58 |
| J | No Shield | 260 | 369 | 11 | 18 | 45 |
| | With Shield | 312 | 388 | 26 | 18 | 60 |
| Totals | No Shield | 3058 | | 44 | | 170 |
| | With Shield | 3577 | | 204 | | 376 |

Fig. 14

SEGMENTED RADIATION DETECTOR WITH SIDE SHIELDING CATHODE

TECHNICAL FIELD

The present invention relates to the field of radiation detectors and, more particularly, to detector assemblies employed for X-Ray and Gamma ray imaging.

BACKGROUND OF THE INVENTION

High-resistivity semiconductor radiation detectors are widely used for detecting ionizing radiation due to their ability to operate at room temperature, their small size and durability, and other features inherent in semiconductor devices. Such detectors are used in a wide variety of applications, including medical diagnostic imaging, nuclear waste monitoring, industrial process monitoring, and space astronomy. Ionizing radiation includes both particulate radiation, such as alpha or beta particles, and electromagnetic radiation such as gamma or x rays.

Conventional semiconductor radiation detectors can be configured in several types, for example, planar or monolithic. The simplest form is a planar detector 1 which includes a semiconductor crystal 3 located between cathode 2 and anode 4 electrodes, as shown in FIG. 1A. To use the detector as an imaging device, the anode electrode should be fabricated into segments, such as pixels as shown in FIG. 1b. The device in the former case is generally referred to as conventional pixilated detector. In FIG. 1b, the architecture of such conventional pixilated detectors 6 typically consists of a slab of semiconductor crystal 3 with metal covering two opposing surfaces of the slab to form two electrodes, a cathode 2 and anode pixels 7. There are various configurations to apply a field 5 across the electrodes including applying an external voltage from an external voltage source (not shown) to either the pixilated anodes 7 or the cathode 2, or both. For example, a pixilated anode 7 may be connected to external signal processing circuitry (not shown) and to ground, and the cathode 2 is connected to an external voltage source (not shown). The bias voltage across the electrodes 2, 7 results in an electric field distribution. Electron and hole "charge clouds" generated within the semiconductor crystal 3 by an ionizing radiation event A absorbed within the slab of semiconductor crystal 3 are swept toward the anode 7 and cathode 2 electrodes, respectively. These moving electron and hole clouds create charge-pulse signals in the external signal processing circuitry (not shown).

If all the electrons and holes generated by the ionizing radiation A reach their respective electrodes (i.e., the electrons reach the anodes 7 and the holes reach the cathode 2), the output charge signal will exactly equal the charge from the energy deposited within the crystal 3. Because the deposited charge is directly proportional to the energy of the ionizing radiation A, the semiconductor radiation detector 6 provides a means for measuring the energy of the ionizing radiation A. The ability to measure this energy is an important function of radiation detectors.

Conventional pixilated radiation detectors, however, suffer from a serious drawback: because of limited field confinement of known electrode structures, some of the electrons and holes near the edge are generally lost by leaking to the side surface as they sweep toward their respective electrodes. The result of this drawback is poor charge collection efficiency for the outer pixels, and increasing side surface leakage current. This effect is particularly acute in the so-called edge (outer) pixels and evident even in the first inner pixels. It is desired to have an array of anode pixels with near-identical high performance, for improved imaging accuracy.

LIMITATIONS OF CURRENT ART

There are various techniques that have been used to improve detector charge collection performance, called herein correction techniques. Specifically, the limitations of known designs for field focusing and electron steering electrodes are reviewed. The purpose of field focusing is primarily to reduce charge loss and secondarily reduce surface leakage current.

For illustration, in FIG. 1a, a single channel planar detector is shown in cross-section with modeled electric-field lines 5, assuming a bias potential applied across the two electrodes. The detector 1 includes semiconductor crystal 3, cathode electrode 2, anode electrode 4. The edge field lines are shown extending substantially into free space. An ionizing event at location A near the sides, results in surface loss of some generated electrons. Charged carriers generated near the edges drift to the sides of the detector along the bending field lines, resulting in some charge loss as well as higher surface leakage current along the edges. While shielded single channel designs have been used, an example being US patent publication No. 2001/0035497, limitations include manufacturing challenges of processing each channel, efficiency is reduced, variability is increased as discrete bulk crystal is processed for each channel, and so-called monolithic detectors using an electrode array is preferred for mass production.

Of more interest for high resolution imaging applications is the conventional pixilated detector, shown in FIG. 1b with no guard ring or side-shielding. The anode electrode is formed as a pixilated array with pixels 7. Again when a bias potential is applied, the modeled outer field lines extend significantly into free space, and some of the charges generated near the edges will not be collected by the edge pixels due to the edge field lines density being similar to the detector in FIG. 1a. A common problem associated with pixilated array detectors is the poor performance of the edge pixels and next to edge pixels as compared to the other pixels in the detector. This performance problem occurs even with a uniform defect-free semiconductor material, and high quality device fabrication processing. Hence various known correction methods have been created to modify and correct for the edge field profile, such as guard rings, steering electrodes and signal processing.

In FIG. 1c, a pixilated detector is shown with a third electrode 9 around the sides connected to be at equal potential with the anode pixels. There are two cases for this design. If the cathode 2 is negatively biased, the third electrode is left floating. If anode pixels are positively biased, the guard ring 9 is connected in common with the anode potential. More charge loss around the edge results in this case despite reduced side surface leakage current due to equipotential between the anode and third electrode. Variants include preferably an insulating layer between the guard ring and surface of the semiconductor. For example, copper tape has been used for many years with CZT (cadmium zinc telluride) detectors in technical articles, being wrapped around the edges of the monolithic semiconductor and spaced centrally such that shorting to either electrode is inhibited, limiting how much of the side surface can be shielded. The wrapping band design as used in FIG. 1c, regardless of floating or connecting to either cathode or anode (same bias), only serves to reduce surface leakage current via equal-potential-surfaces effect, but not to effectively focus the field lines at the edges of the semiconductor.

A variation of FIG. 1c has the third electrode at equal potential with the cathode electrode, as shown in FIG. 1d. Similarly, there are two cases for this configuration. If the cathode is negatively biased, the third electrode 11 is wired to the cathode. If the anode pixels are positively biased, then the third electrode 11 is floating or grounded. This results in improved charge collection at the edge pixels, but still has some inactive corner regions near the cathode side. Variants include the third electrode being applied with and without an insulating layer. For example, the following patents to Imarad, U.S. Pat. Nos. 5,905,264, 6,034,373, and 6,765,213 disclose a third side electrode design for radiation detectors. The discrete third electrode in U.S. Pat. No. 5,905,264 demonstrates FET-like behavior for charge cloud steering and can be floating, and includes an insulating layer between the third electrode and semiconductor surface. In U.S. Pat. No. 6,034,373, the location of the third electrode is expanded to include in the anode pixel plane, and in U.S. Pat. No. 6,765,213, the third electrodes are in a grid surrounding each anode pixel and the monolithic tile has an insulating conducting band around the device. For the versions with additional anode grids, the assembly and testing a large array of such devices is complex and expensive, resulting in greater variability in the device and lower yields of operable devices, and an additional bias circuit is required, increasing the cost and complexity of the overall detector system.

The purpose of improving charge collection and modifying edge electric field pattern in a monolithic pixilated detector does not require operating a third electrode in FET-like operation, such as shown in the Imarad patent. Orthogonal coplanar anode strip devices or pixilated devices with additional steering grids or the like all fall into this class of steering electrodes. Steering electrode designs (i.e., having more than 2 essential electrodes, in addition to cathode and anode) although somewhat shaping the field lines and consequently increasing the charge collection efficiency, have two key limitations. First, they increase surface leakage current excessively, limiting their use in high bias voltage applications and, secondly, are not practical for mass production due either to high cost or difficulty in the assembly of a large number of array modules caused by the complex structural design/hardware electronics associated with these designs.

Single channel detectors were a historical precursor to pixilated detectors. A single channel detector while easy to fabricate is limited in size and cannot be used in large area imaging. An array of single channel detectors is not cost effective for large area imaging, and has lower detector efficiency. However, some of the single channel developments which improve charge collection demonstrate methods for enhancing edge field distribution, but have been limited to single channel implementation and fabrication.

In FIG. 2a, a cross-section of single-channel detector is shown, in a Frisch-grid configuration. Semiconductor 3 has cathode 13 and anode 15 on opposing surfaces, and side electrodes 14 are shown, biased to the cathode for steering the field towards the anode collector. The Frisch-grid electrodes are typically located near the anode, and have been disclosed for single-channel designs.

The so-called SOCKS electrode design is described in patent publication 2001/0035497 with an air gap (no contact). To demonstrate the field effect, a theoretical cap with no insulator is shown in FIG. 2b, having excellent e-field focusing but no small pixel effect. These virtual Frisch-grid devices (CAP, Socks can be considered to also fall into this class of Frisch-grid) currently are applied to single channel applications mainly requiring a "bar-shape" for the discrete channel i.e., the detector-length must be longer then the detector-width or in case of extended claims (like U.S. Pat. No. 6,727,503) only in the form of an array of "discrete" detectors and not a monolithic pixilated device.

A preferred encapsulant used for protecting the surfaces of radiation detectors is polymer-based such as commercially available Humiseal (trade name). Often, the encapsulant is applied at least to the sides of the detector tile. The relatively low softening temperature of the polymer (as opposed to a deposited oxide coating) has additionally restricted coating an adherent gold layer onto the polymer encapsulant on the sides and represents a fabrication challenge to creating an optimal side electrode, as the present inventors are not aware of prior art CZT devices with gold conductor portions deposited over Humiseal which demonstrate excellent adhesion.

Using monolithic CZT in high voltage applications (for example above 1000V applied to a 5 mm thick tile) is not known to be demonstrated, due to high leakage current causing shorting.

In summary of known art, research into the edge pixel performance problems has not resulted in an effective and straightforward solution practical for mass production. While limited success was achieved with some of the aforementioned "correction" approaches such as using multi-terminal devices with steering electrodes, these methods have been limited and further not suitable for industrial manufacturing of imaging devices due to both technical difficulties and high costs associated with process complexity. Technical difficulties have included performance limitations such as high leakage current resulting in devices unsuitable for applications where high applied voltage is required (~1500V and above) such as in X-ray CT. Assembly of large array pixilated detectors has been difficult. Reported results of pixilated detector performance, especially in CZT detectors, show a significant percentage of poorer performance pixels at the edges. This has been speculatively attributed to poor attachment/contact in the attached readout electronics due perhaps to defective bonding. Although this may contribute in specific examples, the core problem remains the incomplete charge collection of the pixels at the detector edges.

SUMMARY OF THE INVENTION

A radiation detector design and method are provided that solve the edge pixel performance problem in pixilated radiation detectors, without the use of multi-electrode or other presently known correction methods, and avoid drawbacks associated with those correction techniques. Further, the designs are practical for manufacturing. The embodiments of detector and electrode design demonstrate that the resulting device leakage current, the surface leakage current in particular, is not increased to an excessive level as often observed with multi-electrode designs. The leakage current of the embodiments minimize electronic noise and provide good detector energy resolution, especially of the edge pixels. Additionally, for the case of CZT pixilated detectors, applications in X-ray imaging are enabled. The low level leakage current allows the operation of the device at high bias voltages (>>200V/mm or >>1000V/5 mm)—a condition required in X-ray imaging applications, (especially medical imaging), which is believed to be currently unfeasible to achieve with existing technologies.

The embodiments of the present invention provide semiconductor detectors having reduced leakage current adjacent to the side walls and other detector surfaces thereof, thereby improving the charge collection efficiency, the signal-to-noise ratio and the energy resolution of the detectors. There is thus provided in accordance with an embodiment of the present invention a semiconductor detector or an array of semiconductor detectors, each detector including a substrate formed of a semiconductor material and defining first and second opposite facing surfaces, cathode electrode formed on the first and pixilated anode electrodes on second opposite facing surfaces of the substrate, an electrical insulator formed on at least part of at least one of the sides between the first and second opposite facing surfaces of the substrate, and the cathode electrode extending around the side edges continuously and formed over at least part of the electrical insulator. The electrodes on the second surface of the substrate may be in the form of an array of mutually spaced pixilated anodes, and the electrode on the first opposite facing surface would then be its corresponding cathode. The extended shielding design of the cathode ensures the field lines around the edge of the detectors are well focused into the edges pixels, resulting in significant reduction of charges loss and subsequently improved charge collection efficiency of the edge pixels. The performance of the edge pixels and hence of the whole imaging detector is thus significantly improved.

In accordance with another preferred embodiment of the present invention, the insulator in the embodiments may also be formed on at least part of a side wall of a detector, and an insulated side portion of the cathode formed over at least part of the electrical insulator formed on at least part of the side wall. In an alternate embodiment, the cathode with side portion may be two or more conductor layers formed to act as one electrode.

In accordance with another preferred embodiment of the present invention, the semiconductor tile is Cadmium Zinc Telluride and the electrode material is gold, and the cathode electrode extends around the tile sides approximately between forty to sixty percent of the side thickness. The detector leakage current density is less than 6 nA/mm2 at a bias potential of substantially 1400V, suitable for detecting an X-ray image. This detector embodiment is responsive to gamma radiation such that the energy resolution full width half maximum of more than 90% of the pixels is less than 6%.

Reliable and low cost methods of fabricating high performance pixilated CZT detectors suitable for X-rays and gamma-rays radiation detection and imaging are provided.

In still another preferred embodiment of the present invention, a method for fabricating a pixilated radiation detector is provided, each detector including a substrate formed of a semiconductor material and defining first and second opposite facing surfaces, cathode electrode formed on the first and pixilated anode electrodes on second opposite facing surfaces of the substrate, an electrical insulator formed on at least part of at least one of the sides between the first and second opposite facing surfaces of the substrate, and the cathode electrode extending around the side edge formed over at least part of the electrical insulator, the method comprising the steps of forming an electrical insulator on at least part of at least one of the side facing surfaces of the substrate, and forming an insulated cathode portion on at least part of the electrical insulator.

Additionally, there is provided in accordance with a preferred embodiment of the present invention a method of fabricating an improved radiation detector, the steps in the method being, forming cathode and anode electrodes on at least major opposing planar surfaces of a semiconductor crystal tile, etching a pixel array on the anode electrode, applying an insulator to at least the sides of the tile, masking a portion of the sides of the tile, forming a conductor layer over the unmasked side regions and overlapping the cathode electrode to provide a continuous cathode conductor.

As commonly used within the industry, encapsulant is understood to equivalently include dielectric and insulating materials of all forms, suitable to seal and protect the semiconductor surface from external damage, handing, or unintended modification of surface properties deleterious to detector operation.

As commonly used within the industry, tile is understood to be equivalent to substrate.

BRIEF DESCRIPTION OF THE DRAWINGS

FIG. 1a: Planar CZT detector; FIG. 1b: Conventional pixilated detector; FIG. 1c: Pixilated detector with guard ring or third electrode around the sides at equal potential with the anode pixels; FIG. 1d: Pixilated detector with guard ring or third electrode around the sides at equal potential with the cathode electrode.

FIG. 2: ELECTRODES FOR SINGLE CHANNEL RADIATION DETECTORS: This figure shows cross-sections of examples of prior art electrode structures for single channel detectors and electric field lines at the edges, including a) and b).

FIGS. 12A and 12B: DETECTOR WITH SIDE-SHIELDING CATHODE AND MULTILAYER PIXELS: These figures show a cross-section of a side-shielded monolithic radiation detector with three additional conductor layers on the anode pixel. FIG. 12B is a close up of section "G" in FIG. 12A.

FIG. 14: SIDE-SHIELDED DETECTOR RELIABILITY PERFORMANCE: This figure shows detector response data from 10 typical radiation detectors with and without the side-shielding cathode electrode.

DETAILED DESCRIPTION OF THE INVENTION

Radiation detection, in particular for gamma or X-ray radiation, typically utilizes II-VI semiconductor single crystal, for example CdZnTe, CdTe, ZnTe, ZnSe, CdSe and the like. The detector electrode designs herein can be applied to any semiconductor detector material with suitable modifications to conductor and insulator selection and electrode processing, however the description will demonstrate the designs for the preferred case of CdZnTe.

The detector design has the cathode extending over the side of the semiconductor tile. There are various implementations and fabrication methods for achieving the side-shielded cathode designs, as described herein.

Figure 3:
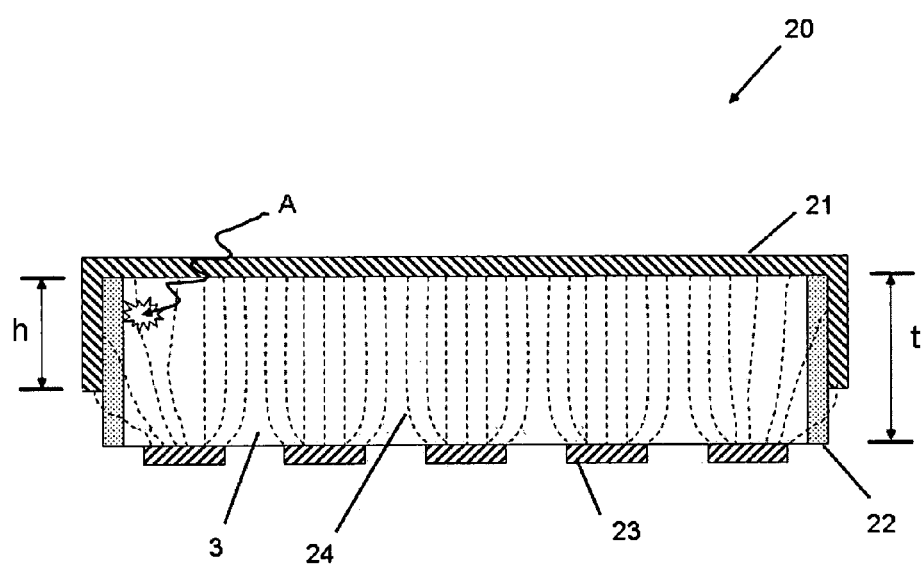
FIG. 3: DETECTOR WITH SIDE-SHIELDING CATHODE: This figure shows a cross-section of a monolithic radiation detector with overhanging cathode and dielectric encapsulant, and improved electric field confinement.

The basic version of an exemplary pixilated radiation detector 20 is illustrated in FIG. 3 in cross-section. A single crystal tile 3 of CdZnTe is provided as a rectangular slab with major opposing surfaces as common in the industry, and having thickness t. Typically the tile is substantially rectangular in shape, and further may be square with equal rows and columns of pixels, but may be any geometric shape required by the imaging application. An electrically insulating material (referred to herein simply as "insulator") 22, comprised of an encapsulant or other insulating material, is applied on sides of the tile 3. In the preferred case the insulator is applied on the entire side for ease of processing. An anode pixilated array 23 is formed on the major surface positioned to be opposite the incident radiation, for the purpose of collecting generated charge and forming a 2D image from pixel response. Pixels are defined as equivalent to anode segments having any geometric shape and, in the preferred case, pixels may be substantially square. For illustrative purposes, the side-shielding cathode electrode 21 is shown as a continuous single conductor. In fabrication as will be described later, this may in effect be applied in two portions; the first directly on the tile surface opposing the pixilated anode array 23, and the second side portion extending over the tile sides and partially covering the insulator 22. Preferably the insulator encapsulates the full surface of the sides without contamination. However, in alternate embodiments it may also be separated in two insulating portions. The side portion of the side-shielding cathode 21 extends a height h as shown from the cathode plane (major surface) of the tile towards the anode plane of the tile. The height can be maximized to provide shielding and field shaping but is preferably adequately limited to reduce shorting between anode and cathode when a bias voltage is applied between them. For the case of Cadmium Zinc Telluride semiconductor and gold conductor, the preferred height is within the range approximately 40-60% of tile thickness. In this case, it was observed at a height at 70% of thickness, that surface leakage current significantly increased and was unsuitable. The effect of side electrode height is shown in Table 1. In the case of a typical 5 mm thick detector, the preferred side shield portion extends ~2.5-3 mm.

Electric field lines are shown as dashed lines, and were derived using standard techniques similar to the prior art illustrations in the background. The field lines demonstrate improved field confinement relative to unshielded, guard rings and third electrode designs. During operation as a radiation detector, generated charge near the edges of the tile from an incident radiation wave is partially collected at the closest anode with higher efficiency than alternative detector corrective designs. In the preferred example for CZT semiconductor, the electrodes are gold and the insulator is polymer encapsulant such as Humiseal or other suitable polymer encapsulants. Alternatively, the insulator may be an oxide, such as tellurium oxide, cadmium tellurium oxide, silicon oxide, aluminum oxide, etc., or other insulating materials, such as nitrides and oxynitrides, formed by physical deposition or other methods. The gold electrodes may be formed by an electroless process as well.

The side-shielding cathode design ensures the resulting device leakage current, the surface leakage current in particular, does not increase to an excessive level as often observed with multi-electrode designs. The fabrication method of the invention does increase leakage current but at a much reduced rate relative to known fabrication methods, by maintaining surface stoichiometry. This minimizes electronic noise, leading to good detector energy resolution, especially that of the edge pixels. More importantly, the low surface leakage current characteristic implies low surface conductivity which in turn means reduced electric field line bending in the side shielded cathode detector. Hence the field is more confined within the bulk semiconductor. Additionally, the extended shielding design of the cathode further ensures the field lines around the edge of the detectors are well focused into the edge pixels, resulting in significant reduction of charge loss and subsequently improved charge collection efficiency of the edge pixels.

Figure 4:
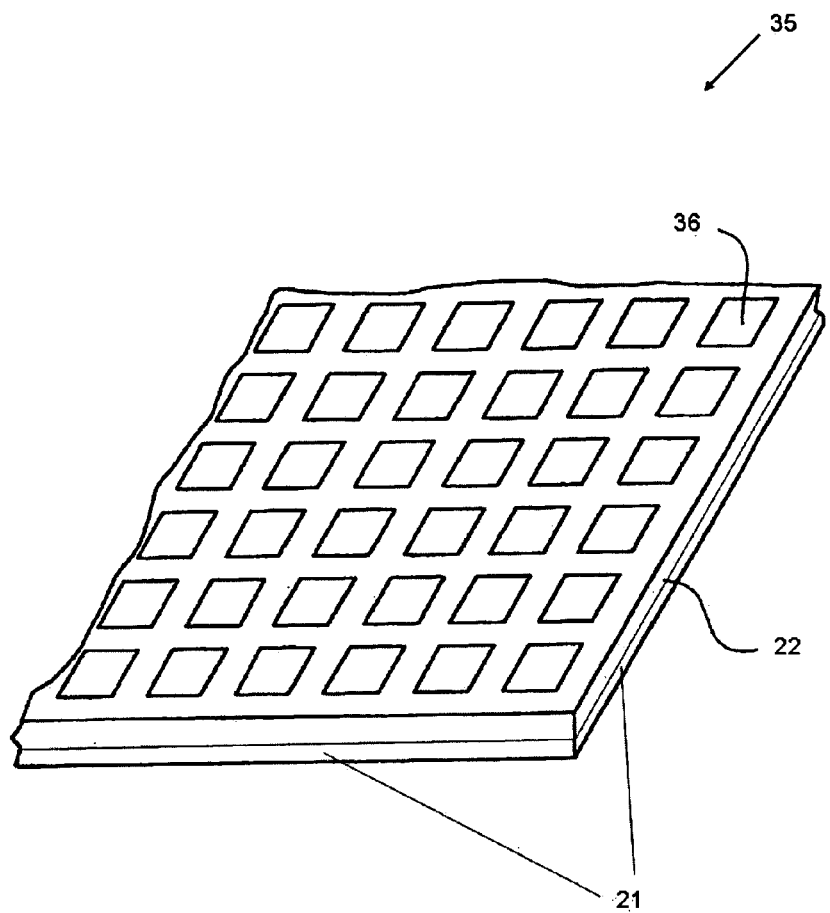
FIG. 4: DETECTOR WITH SIDE-SHIELDING CATHODE: This figure illustrates a perspective cutaway of a monolithic detector with pixilated anode array and side-shielding cathode.

FIG. 4 illustrates a perspective cutaway of a monolithic detector 35 of an embodiment of the invention. Pixilated anode array 36 covers the upper major surface and the side portion 21 of side-shielding cathode is shown. Insulator 22 not covered by the side portion protects the side surface and isolates an electrical path from anode pixels to side cathode. In an alternate embodiment, the anode pixels extend right to the edge of the anode surface of detector 35. The dimensions of the imaging array are determined by application requirements. In general, the pixel array may be m by n pixels. Common array dimensions for Gamma and X-ray detectors are 8×8, 11×11 and 16×16. Typical tile sizes for CZT detectors are 20×20 mm or 40×40 mm. The side-shielding cathode can be implemented in any tile size or array dimensions. With common configurations, the percentage of edge and next-to-edge pixels is substantial, and edge performance improvement results in a dramatic overall imaging performance by the detector.

The performance of the side-shielded cathode detector varies with the height of the side portion of the cathode as described earlier. For the preferred case of a CZT semiconductor tile and gold electrodes, the side cathode depth was varied to determine the optimum range, with a summary of results indicated in Table 1 below. The tile example has an anode array of eight by eight pixels for a total of sixty four. Typical performance metrics include energy resolution and total surface leakage as commonly measured by standard techniques in the radiation detection industry. As expected, the surface leakage current increases with the area of the cathode conductor and a tradeoff is sought between acceptable small increases in surface leakage current for relatively large improvements in the number of pixels with energy resolution less than 6% FWHM. The energy resolution (ER) parameters reached an optimum at 3 mm side cathode depth with a high yield of 63 out of 64 pixels (of an 8×8 array having 28 edge pixels and 64 total pixels) demonstrating FWHM<6%. At the optimum depth, bias voltage was successfully increased to 2000V without tunneling or shorting of the electrodes. At increased depth, the surface leakage current increased dramatically to unusable levels. For the preferred height of 3 mm, the surface leakage current per pixel is low, approximately 210/64=3.3 nA/pixel.

TABLE 1

ER and SLC as a function of side cathode depth

| Cathode Side Shield on | # of pixels with ER FWHM < 6% | | Total Surface Leakage Current (64 pixels) |
|---|---|---|---|
| 5 mm thick CZT tile Side shield depth (mm) | Edge pixels | All pixels | @ 1500 V bias (nA) |
| 0 (none) | 0 | 27 | 80 |
| 1.5 | 8 | 34 | 150 |
| 2 | 22 | 57 | 165 |
| 2.5 | 27 | 61 | 180 |
| 3 | 28 | 63 | 210 |
| 3.5 | 26 | 61 | 900 |

Much higher charge collection at the edge pixels occurs in the side-shielding cathode design, and the corner regions near the cathode side are fully active (in terms of charge collected from events near the corner regions). Note, there are no additional electrodes required beside the cathode and anode, as the cathode is configured in a novel manner. However, due to the insulating layer on the side surfaces of the detector underneath the side shielding portion of the cathode, new fabrication techniques were required. Reliable and economical methods of fabricating the device and insulating layer are provided (for example in FIG. 13).

Preferably the cathode side portion is continuous, encircling all sides of the tile. However for esoteric detector configurations, the side portion may be discontinuous for portions where the pixels are spaced inwards or there are no pixels proximal to the tile edge, for example in a non-rectangular shaped tile. For all embodiments, the side portion of the cathode is insulated from the semiconductor.

Figure 5:
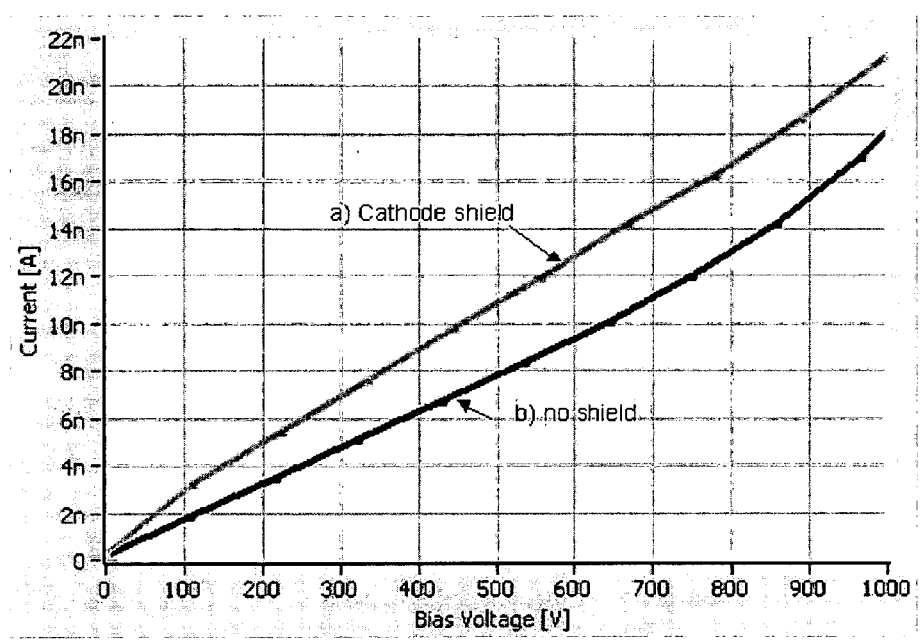
FIG. 5: ELECTRICAL CHARACTERISTICS OF DETECTOR WITH SIDE-SHIELDING CATHODE: This figure shows measured current-voltage curves for a) side-shielded cathode and b) no shield.

It is illustrative to show the effect of the side shielding cathode on leakage current as conventional understanding would expect a significant increase in leakage current as the total area of the cathode is increased a substantial amount. The leakage current is a broad measure of the electrode performance, and demonstrated in the detector I-V plot of FIG. 5 under bias potential for both a shielded and conventional cathode design. The side-shielding cathode current is slightly higher than the unshielded but the increase is minimal and acceptable in overall detector performance when compared to the charge collection efficiency gain.

Figure 1:
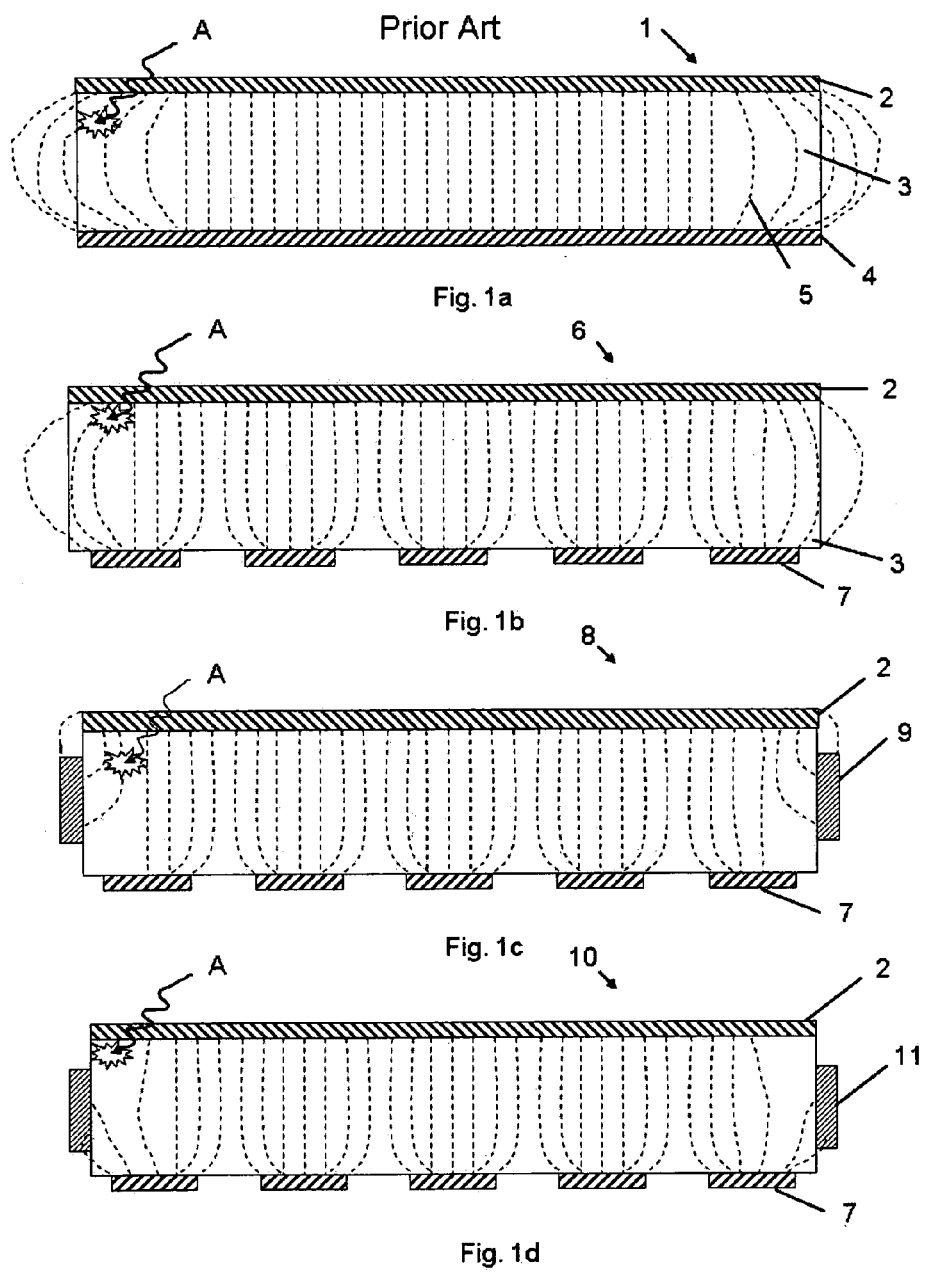
FIG. 1: ELECTRODES FOR RADIATION DETECTORS: This figure shows cross-sections of prior art electrode structures illustrating electric field lines at the edges, including a) b) c) d).
Figure 6:
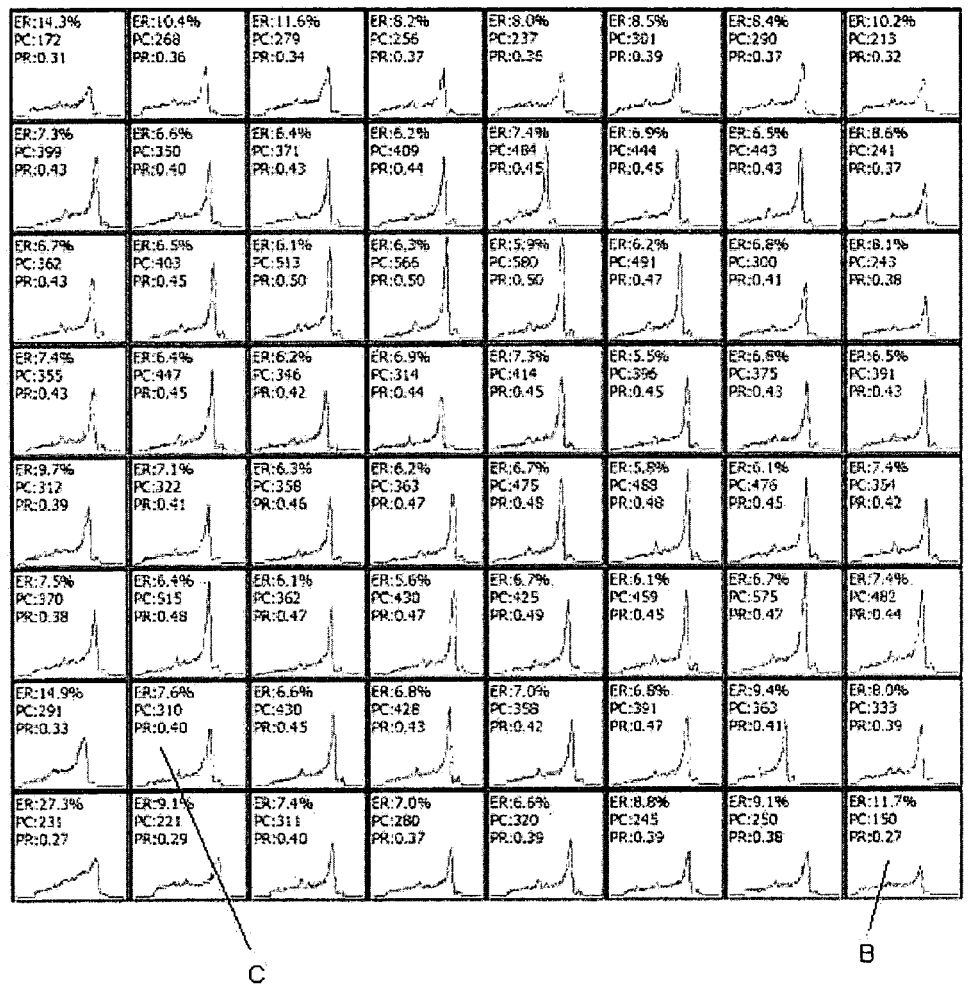
FIG. 6: UNSHIELDED DETECTOR PIXEL PERFORMANCE: This figure shows gamma radiation response for each pixel in an unshielded detector including c) inner row and b) outer corner pixels.

Specific improvements of the electrode design performance are demonstrated on a pixel-by-pixel response under gamma radiation testing, to compare the side shielded embodiment to a conventional detector. In FIG. 6, gamma radiation response is shown for each pixel in an unshielded detector similar to the embodiment in FIG. 1b (no side shielding). The radiation source was Co-57; (Main measured photopeak at 122 keV), bias voltage 500V. The irradiation is nearly uniform across the whole cathode surface of the pixilated detector. The test samples were configured as 8×8 pixels that are 20×20×5 mm in dimension. Radiation performance data is shown for each pixel including energy resolution (ER) and peak count (PC), as commonly defined in the radiation industry. The graphs show sharp and high energy peaks in the center pixels, but reduced peak count and increased peak width in inner and outer edge pixels. The most dramatic performance degradation is evident in the corner pixels, as expected due to the field line bending and reduced charge collection efficiency.

For this conventional design baseline example, as shown at pixel B, the corner pixel (worst case) is measured to have;
ER=11.7%
PC=150

For comparison, as shown at pixel C, an inner corner pixel is measured to have performance better than the corner pixel but still degraded relative to the inner central pixel performance;
ER=7.6%
PC=310

EXEMPLARY EMBODIMENT PERFORMANCE

Figure 7:
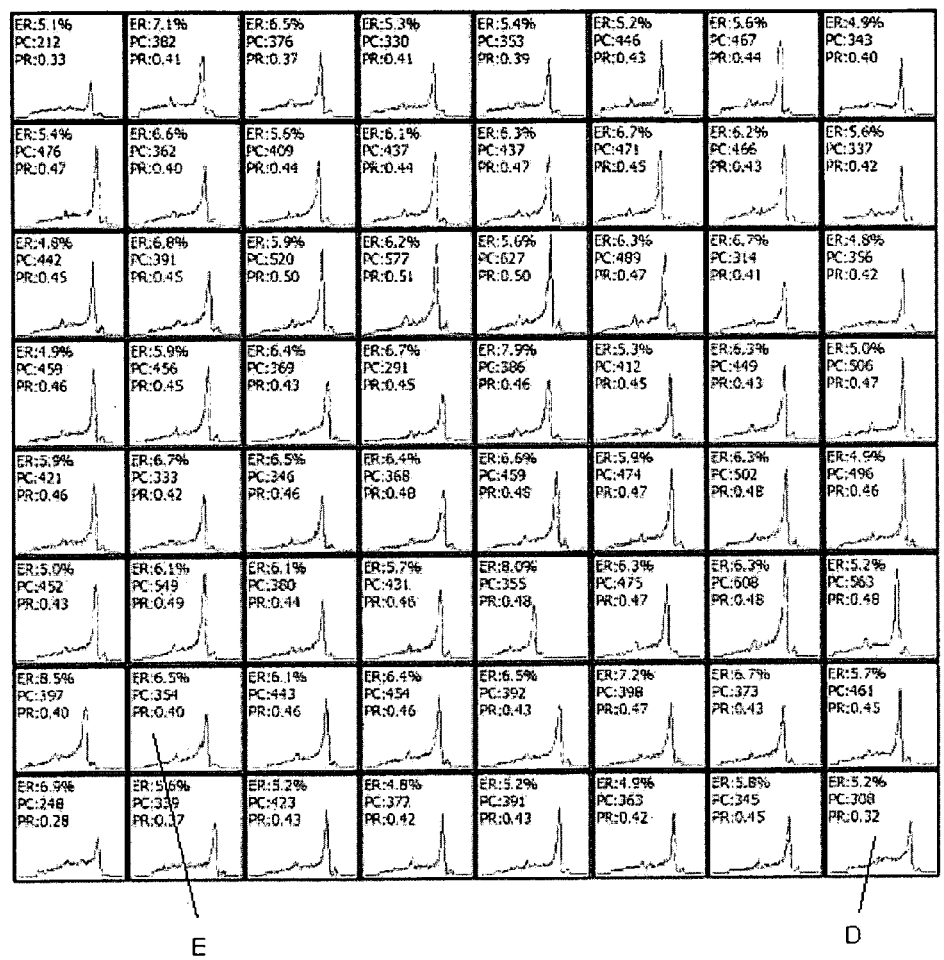
FIG. 7: SIDE-SHIELDED DETECTOR PIXEL PERFORMANCE: This figure shows gamma radiation response for each pixel in an side-shielded detector including e) inner row and d) outer corner pixels.
Figure 9:
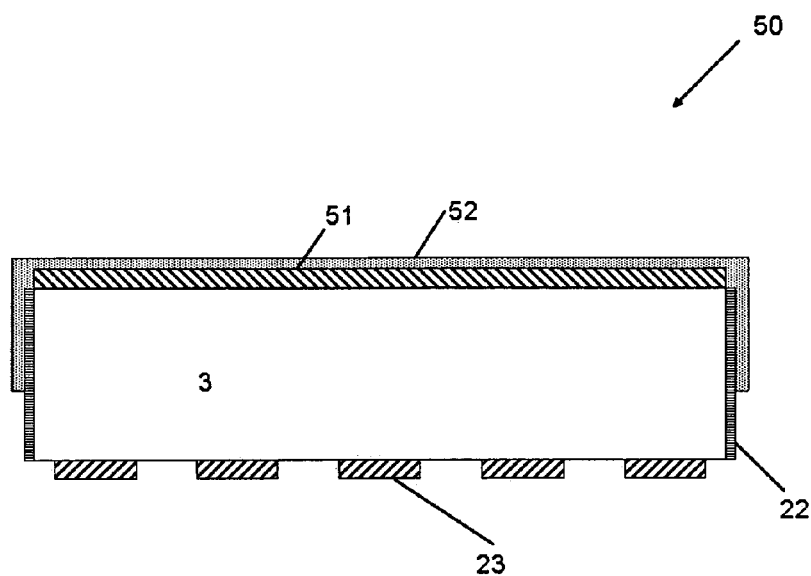
FIG. 9: DETECTOR WITH TWO LAYER SIDE-SHIELDING CATHODE: This figure shows a cross-section of a monolithic radiation detector with overhanging cathode formed of two conductor layers.

The previous unshielded results are compared to a radiation detector with the modification of side-shielded cathode embodiment of FIG. 9, with test results as shown in FIG. 7. The CZT detector configuration corresponded to the conventional baseline example for array and tile dimensions. Tile thickness was 5 mm, the anode array was 10×10 pixels, and the electrodes were gold, and the side insulator was Humiseal polymer, and the side portion extends 2.5-3 mm. The radiation source was Co-57; radiation energy 122 keV, bias voltage 500V. In general, a dramatic improvement in the FWHM energy spike on the outer pixels is demonstrated with improved peak counts. Both of these measures improve signal to noise and quality of derived signal. Improvements in charge collection efficiency result in improvements in both energy resolution and peak counting efficiency, as shown. The side-shielding cathode detector improves both outer corner pixels (typically affected the most by shielding) and also inner row pixels. Correcting the total surface leakage current for pixel dimensions, detector leakage current density was typically less than 6 nA/mm$^2$ measured at a bias potential of 1400V.

For example as shown at pixel D, the improvement in the corner pixel is measured as;
ER=5.2%
PC=308

For example, as shown at pixel E, the improvement in the inner corner pixel is measured as;
ER=6.5%
PC=354

Therefore the side-shielding cathode detector is demonstrated to improve significantly the metrics of energy resolution and peak count. Specifically, the energy resolution is reduced by a factor 2 for the example corner pixel, showing increased charge collection efficiency for improved correlation to ionizing radiation energy. The corner pixel peak count is also approximately doubled, improving signal to noise and enabling lower thresholds of ionizing radiation energy to be detected. As the corner pixel is expected to gain the most, it is instructive to compare an inner corner pixel E. The inner corner pixel shows a reduced impact of about 20% improvement but demonstrates the improvement extends to the next row of pixels. Non-corner edge pixels additionally are improved as shown. The improvements are typical of relative enhancements observed in repeated experiments using CZT semiconductor of various grades.

The improved performance is consistently observed across multiple samples and edge pixels, for the preferred CZT detector design. The repeatability and reliability of performance was tested over 10 typical samples, with and without the side-shielding cathode and the test data is shown in FIG. 14, for peak count and energy resolution. There was variability sample to sample, depending on bulk CZT selected and fabrication process, but in the majority of samples the relative enhancement was dramatic, particularly for the outer pixel performance. A good energy resolution is less than 6% for the energy peak tested, and the average improvement of number of pixels reaching that target was over 400% for the outside pixels. In terms of overall pixels, still a dramatic 200% improvement was recorded. Segmented detectors with the side shielding cathode therefore can produce energy resolution full width half maximum for more than 90% of the pixels under 6%, in response to gamma radiation. Average peak count improvement of the outer (edge) pixels was about 20%. This enhanced detector response results in significant yield improvement of commercially usable devices.

Figure 8:
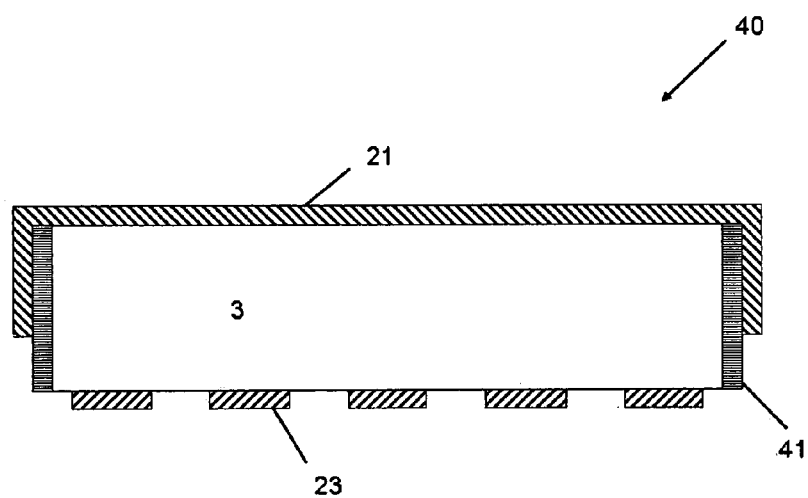
FIG. 8: DETECTOR WITH SIDE-SHIELDING CATHODE: This figure shows a cross-section of a monolithic radiation detector with overhanging cathode and an oxide dielectric layer.

In the preferred embodiment, the side insulating layer is a polymer encapsulant such as Humiseal, however in an alternate embodiment an oxide may be used which can withstand higher temperatures. This may be advantageous when energetic deposition methods are used for all or portions of the cathode electrode, such as sputtering. Radiation detector 40 is illustrated in FIG. 8 with an oxide insulator. Single crystal CdZnTe 3 is coated with the oxide layer 41 on the sides, which may be physically deposited by e-beam or thermal evaporation, then a mask is applied and the oxide layer 41 covered partially by side-shielding cathode layer 21. Tellurium oxide or cadmium tellurium oxide are examples of suitable oxides, as well as other oxide coatings commonly used in the semiconductor industry. The effect is not very sensitive to the thickness of the insulating layer, however it must have a minimum thickness to be properly insulating as well known in the semiconductor art. This embodiment permits the side-shielding cathode to be fabricated as one integral continuous layer.

Fabrication of CZT detectors with high performance is complex. Surface effects resulting from fabrication and materials selection have been shown to have a critical impact on device performance. In another embodiment, the challenges of fabricating the side-shielding electrode in CZT with gold electrodes have been solved by novel fabrication methods and using multiple depositions to form a unitary cathode with side portions, suitable for high performance. FIGS. 9-12 show various embodiments of the side-shielding CZT detector which can also be applied to other radiation semiconductor materials.

In an alternate embodiment the side-shielding cathode can be formed as two conductor layers, as detector 50 shown in cross-section in FIG. 9. Single crystal tile 3 has pixilated anodes 23 formed on one major surface. Insulator 22 is formed on the tile sides. First conductor layer 51 covers the major surface opposing the anode pixels. A second conductor layer 52 coats the first conductor layer and extends over the tile sides as shown. This design is advantageous when the optimum process for surface coupling of conductor 51 to the semiconductor surface is deficient in terms of providing an adherent uniform layer on the side surface. For example, providing an adherent gold layer by an electroless process on a Humiseal insulator coating is challenging due to the acidic properties of the process solutions. Hence two different deposition processes may be used for each cathode portion, as will be discussed in the method description. Preferably the two cathode conductor layers are identical i.e. both gold, but may alternatively be different conductors reasonably matched for similar electrical properties.

Figure 10:
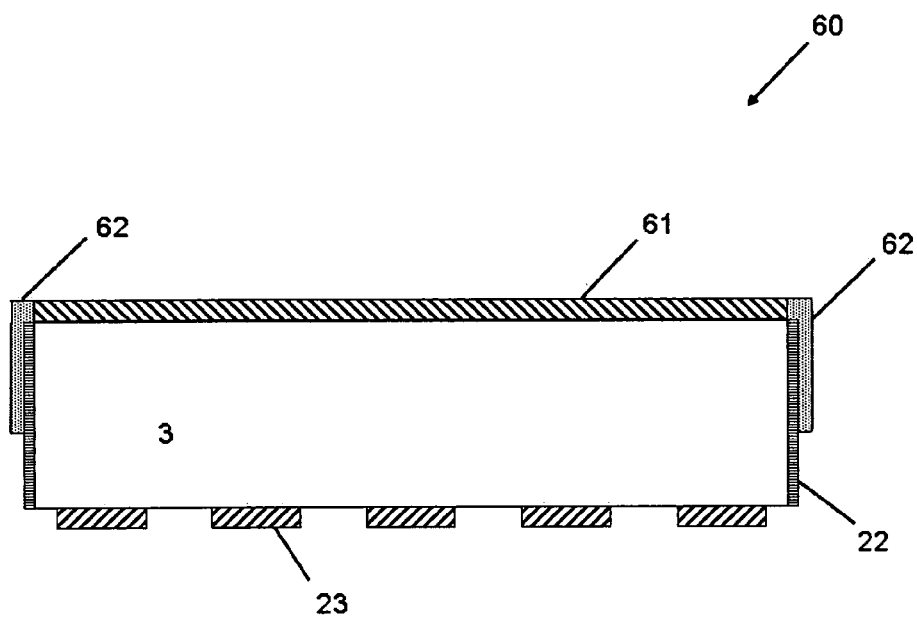
FIG. 10: DETECTOR WITH TWO LAYER SIDE-SHIELDING CATHODE: This figure shows a cross-section of a monolithic radiation detector with overhanging cathode formed of two conductor layers. THIS DRAWING WILL BE MODIFIED.

FIG. 10 shows an alternate embodiment of the side-shielding cathode formed from two conductor segments, for detector 60 shown in cross-section. First cathode conductor layer 61 covers the major tile surface. A second conductor layer 62 is formed to butt against layer 61 for excellent conduction, and to extend over the peripheral surface around the central portion, as well as over the tile sides and insulator 22. For example, the first conductor layer 61 could be fabricated by electroless gold deposition and the second conductor layer 62 could be deposited by sputtering gold, with appropriate masking of tile portions.

Figure 11:
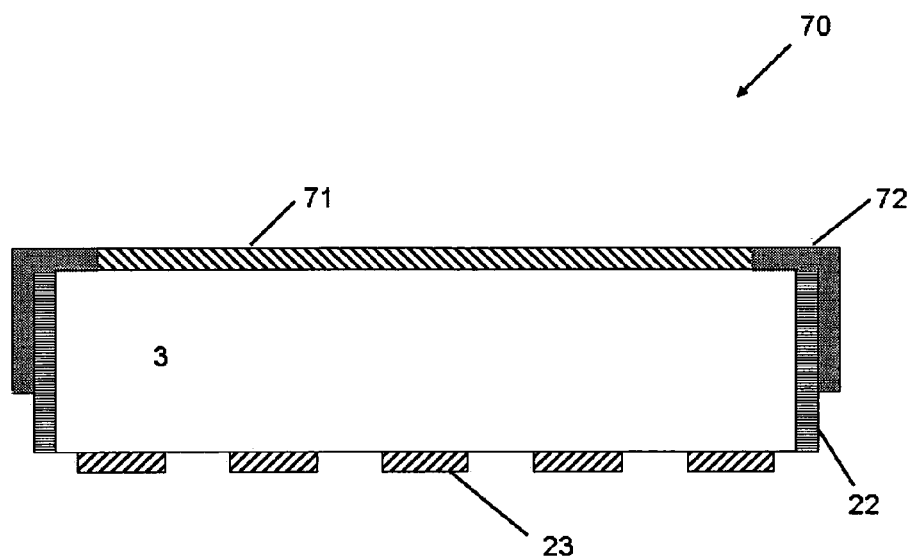
FIG. 11: DETECTOR WITH TWO LAYER SIDE-SHIELDING CATHODE: This figure shows a cross-section of a monolithic radiation detector with overhanging cathode formed of two conductor layers butted together.

A further embodiment of the two portion side-shielding cathode detector is shown in FIG. 11. A cross-section of a monolithic radiation detector 70 has an overhanging cathode formed of conductor layers butted together to form a single side-shielding cathode. First cathode conductor layer 71 covers a central portion of the tile surface. A second conductor layer 72 is formed to butt against layer 71 with a low resistance interface, and to extend over the peripheral surface around the central portion, as well as over the tile sides and insulator 22. For example, the first conductor layer 71 could be fabricated by electroless gold deposition and the second conductor layer 72 could be deposited by sputtering gold, with appropriate masking of portions of the semiconductor tile.

For use in a radiation detector subassembly, the radiation detector must be electrically connected to signal processing circuit boards, without modifying the electrode properties substantially. An intermediary conductor layer(s) may be formed on the anode pixels to reduce deleterious electrical contact effects and thermal damage to the anode pixel. A radiation detector 80 with side shielding cathode 21 is shown in FIGS. 12A and 12B with a tri-layer contact on top of the anode pixels, for suitable contacting detector boards to detector pixels by thermal contacting. The contact layer is smaller or equal to the anode area. The trilayer contact is expanded in view G, showing a platinum layer 81, a nickel layer 82 and a sputtered gold layer 83. Alternatively, titanium or other conductors may be used, or fewer or more than three layers.

Fabrication Processes

There are at least several acceptable processes for fabricating a CZT radiation detector with side-shielding cathode, with varying process complexity and device reliability. These are described for the preferred materials demonstrated in the experimental results, but can be extended substituting known processes for substitute materials. It was found that decreasing or eliminating contamination of the encapsulant/insulator applied to the semiconductor tile sides was important in achieving reduced surface leakage and preferred I-V characteristics of the detector under bias voltage. A sub-method is provided that controls contamination in the side insulators, partly enabling the excellent low surface leakage current reported. In general, a polymer encapsulant is preferred due to ease of processing, but requires adjustment of the other steps of the fabrication process.

Method I is used to fabricate a cathode in one primary cathode deposition step. The steps in method I are i) preparing a tile with anode pixels on one major surface and polymer encapsulant, such as Humiseal on all sides, ii) applying a mask shielding at least 30% of the Humiseal on the sides extending from the anode surface, iii) depositing a unitary gold layer over the opposing major surface and unmasked Humiseal to form an integral cathode with side-shielding portion. The gold deposition process should have suitable cathode adhesion to both the CZT and the polymer encapsulant without melting the Humiseal during deposition. An alternate version of this method has step i) modified to physically deposit a high temperature oxide on the tile sides as the encapsulant, then in step iii) the deposition process can be electroless gold deposition. Yet another embodiment can use a high temperature polymer encapsulant (other than Humiseal) that will provide suitable gold adhesion following the electroless gold deposition process.

Figure 13:
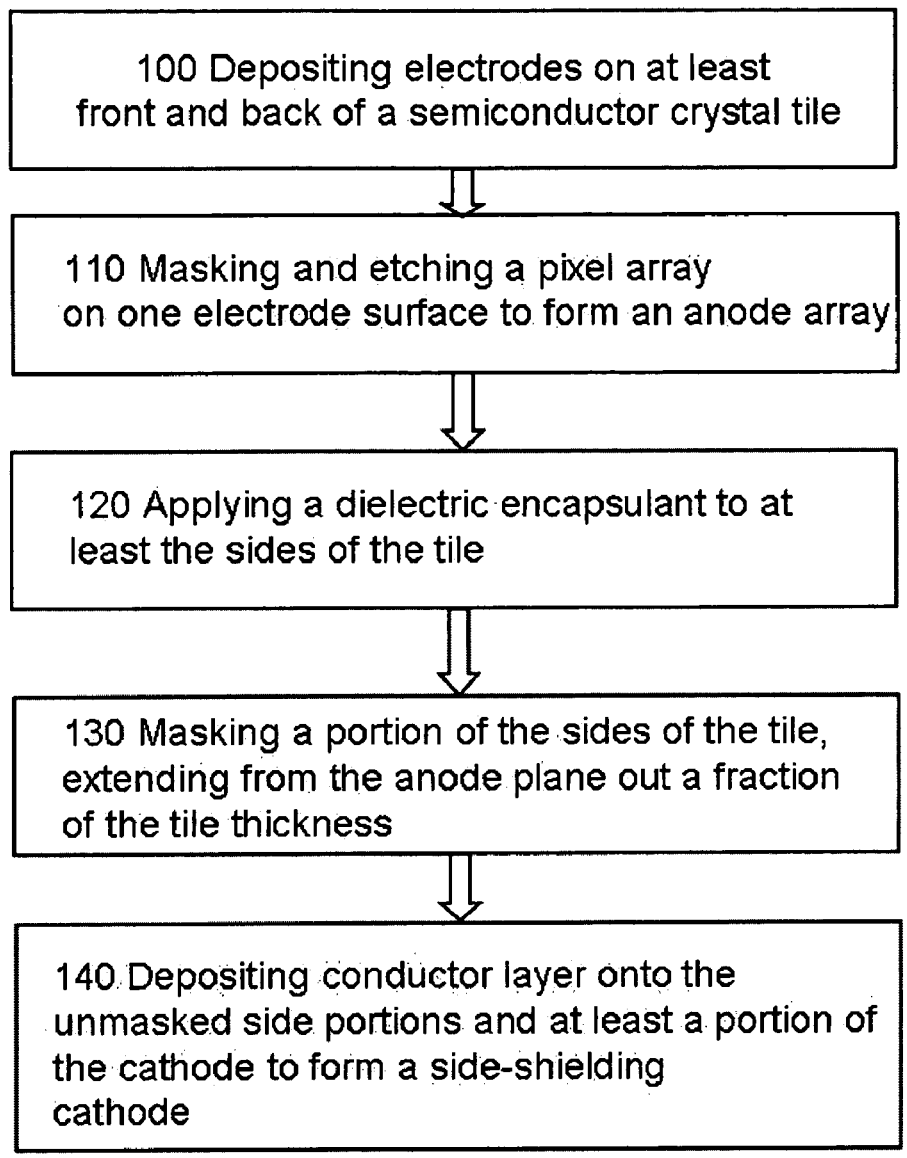
FIG. 13: METHOD OF FABRICATING A SIDE-SHIELDED DETECTOR: The figure illustrates a method of detector fabrication suitable for forming the side-shielding cathode.

Method II applies an electroless gold process to deposit a first thick cathode layer on the tile major surface and then energetic deposition of a second thin side cathode layer on at least the side portions, the two layers coupled to form the side-shielding cathode. The steps of Method II are shown in FIG. 13. As a starting condition a bulk semiconductor tile (for example CZT) is cut and polished on all sides. Step 100 includes depositing thick electrodes on at least the front and back of the semiconductor crystal tile. This may be done by physical deposition or electroless deposition provided suitable adhesion to the device surface is achieved. Then step 110 includes masking and etching a pixel array on one electrode surface to form an anode array. A bromine solution etching method with low interpixel resistance is preferred, although alternate known etching processes may be substituted. Step 120 includes applying a dielectric encapsulant to at least the sides of the tile. The preferred insulator is the encapsulant Humiseal, well used within the industry. This polymer based solution is applied by either dipping (preferred) or brushing/coating the solution to cover the sides of the tile. The coated tile dries for several hours in a clean environment to maintain low contamination levels. Step 130 includes masking a portion of the sides of the tile, the mask extending from the anode plane out a fraction of the tile thickness. For the example of a 5 mm thick CZT tile, 2.5 mm copper tape with adhesive can be uniformly wrapped from the beginning of the anode plane to approximately midway up the tile sides. Then step 140 includes depositing a second conductor layer onto the unmasked side portions and at least a portion of the cathode to form a side-shielding cathode (as configured in one of the embodiments shown in FIGS. 9, 10, 11). The preferred second deposition process is sputtering a gold layer. The sputtered gold layer may be on the order of 50-100 nm or thicker, and may cover parts or the entire major cathode layer from step 100 (per configurations in FIGS. 9-11). Optionally, prior to step 140, the surface leakage current of the device can be tested and if not adequate due to surface effects or fabrication variation, additional side polishing of the tile and repeating of earlier steps may be carried out to ensure a low intrinsic surface leakage current before the final coating step.

Alternatively the insulator in Method II, may be a high temperature oxide, deposited by conventional physical deposition. In this embodiment, the deposition process in step 140 allows physical deposition methods to replace the sputtering process, if desired. For example, an oxide layer of about 100 nm is suitable. Similarly, the second conductor layer may not be matched to the primary cathode conductor, but be suitably matched in conductivity, thermal expansion etc.

Method III proceeds through steps 100-130 of Method II, and then substitutes a physically secured conductor tape which is electrically soldered to the primary cathode layer of step 100. In this method, step 130 is replaced by taping an adhesive conductive tape (copper preferred) in the prescribed desired location of the side cathode shield extending from the cathode major surface plane down approximately halfway in tile thickness. The adhesive layer can be used as a suitable insulator. Step 140 is replaced by soldering the copper tape to the thick primary cathode layer to form an electrically common side-shielding cathode. This process is convenient but challenged by the conductor mismatch, micro-variation in tape contact, and maintaining insulator adhesive thickness near the solder connection at the edge of the tile.

The detector tile arrays described herein may further be assembled side by side in a close-packing arrangement as the cathodes of all the tiles in a large assembly of arrays of pixels are all at the same bias potential.

Thus, the embodiments of the invention provide an electrode shield design for monolithic semiconductor detectors with pixilated array, that is preferably formed from reduced number of components (two electrodes and no additional bias circuitry), provides enhanced electric field focusing impacting both edge and next closest inner pixels, reduced surface leakage from tile edges, and also can be fabricated in a repeatable process for reduced pixel and device variability and improved yields. The embodiments of the invention also provide a monolithic CZT detector suitable for use with gamma-ray and X-ray imaging at high bias voltages above 1000V.

The reader will appreciate that the foregoing description is only intended to be illustrative of the present invention and is, therefore, not to be construed as a limitation or restriction thereon, the invention being delineated in the following claims.

The invention claimed is:
1. A semiconductor radiation detector, comprising:
 a) a semiconductor single crystal substrate comprising first and second major planar opposing surfaces separated by sides of thickness t,
 b) a cathode electrode formed on the first major opposing surface and extending around the sides of said substrate to form at least one side portion,
 c) a pixilated anode electrode array formed on the second major opposing surface, and
 d) an electrically insulating material formed on at least said sides of said substrate,
wherein, said side portions of said cathode electrode extend over at least a portion of said insulating material located on at least said sides of said substrate; and
wherein said detector is responsive to gamma radiation such that energy resolution full width half maximum of more than 90% of the pixels is less than 6%.

2. The detector of claim 1, wherein said semiconductor crystal is cadmium zinc telluride.

3. The detector of claim 2, wherein said cathode electrode comprises gold.

4. The detector of claim 3, wherein said insulating material comprises a polymer encapsulant.

5. The detector of claim 3, wherein said insulating material comprises a high resistivity oxide.

6. The detector of claim 3, wherein said cathode electrode extends around said substrate sides approximately between forty to sixty percent of said side thickness t.

7. The detector of claim 6, wherein the detector leakage current density is less than 6 nA/mm$^2$ for a bias potential of substantially 1400V and said cathode side portion is a continuous side portion encircling said substrate which comprises cadmium zinc telluride.

8. The detector of claim 3, wherein said anode electrode array is configured in an array of a plurality of pixels.

9. The detector of claim 8, wherein said anode electrode array is configured in a rectangular array comprising a plurality of pixels arranged as one of 8 by 8, 11 by 11 and 16 by 16 pixel arrays, and said thickness t is about 5 mm.

10. The detector of claim 3, further comprising at least two conductor layers covering each anode pixel.

11. The detector of claim 10, wherein three conductor layers cover said each anode pixel and said three additional conductor materials are selected from the group of Pt, Ni, Ti and Au.

12. The detector of claim 2, wherein the cathode electrode comprises first and second discrete conductor layers.

13. The detector of claim 12, wherein said first conductor layer contacts the first major opposing surface of the substrate and said second conductor layer is located over the first conductor layer and over the insulating layer on the substrate sides to provide a continuous cathode electrode that wraps around said substrate sides.

14. The detector of claim 1, wherein said semiconductor crystal is a II-VI compound selected from the group consisting of CdTe, ZnTe, CdZnTe, ZnSe, and CdSe.

15. The detector of claim 1, wherein said detector is couplable to one of an X-ray or a Gamma ray detection system for a purpose of detecting an X-ray or a gamma-ray image.

16. The detector of claim 15, further comprising one of said X-ray or Gamma ray detection systems.

17. The detector of claim 1, wherein the cathode electrode is insulated from the substrate sides by the insulating material and the cathode electrode does not contact the substrate sides.

18. The detector of claim 1,
wherein the side portions of said cathode electrode extend over said insulating material to confine an applied electric field between said anode and cathode.

19. A method of fabricating a side-shielding cathode on a semiconductor configured as a substrate with first and second major opposing surfaces separated by sides of thickness t, comprising:
a) depositing a first cathode conductor layer on the first major opposing surface and depositing an anode conductor layer on said the second major opposing surface,
b) etching the anode conductor layer to form a pixilated anode array on the second major surface,
c) applying an electrically insulating material to at least the sides of said substrate,
d) masking a first portion of the substrate sides extending from the second major surface plane to a fraction of said substrate thickness t while leaving the remaining second portion of the substrate sides unmasked, and
e) depositing a second cathode conductor layer on the insulating material exposed on unmasked second substrate side portion, to form a side-shielding cathode electrode having side portions over of said insulating material.

20. The method of claim 19, wherein said first and second cathode conductor layers each comprise a gold layer.

21. The method of claim 20, wherein in step a) said first cathode conductor gold layer is electrolessly deposited and in step e) said second cathode conductor gold layer is sputtered.

22. The method of claim 19, wherein said insulating material comprises a polymer encapsulant applied by dipping the substrate edges in a polymer solution.

23. The method of claim 19, wherein said insulating material comprises an oxide applied in step c) by one of physical deposition or chemical reaction.

24. The method of claim 19, wherein said first cathode conductor layer applied in step a) comprises gold and the second cathode conductor layer applied in step e) is a metal conductor other than gold.

25. The method of claim 19, further comprising depositing the second cathode conductor layer on the first cathode conductor layer.

26. The method of claim 19, wherein the second cathode conductor layer is not deposited on the first cathode conductor layer.

27. The method of claim 19, wherein:
said substrate comprises a II-VI single crystal semiconductor substrate, and
said substrate, anode array and cathode electrode form a radiation detector which is responsive to gamma radiation such that energy resolution full width half maximum of more than 90% of the pixels is less than 6%.

28. A semiconductor radiation detector, comprising:
a) a semiconductor single crystal substrate comprising first and second major planar opposing surfaces separated by sides of thickness t,
b) a cathode electrode formed on the first major opposing surface and extending around the sides of said substrate to form at least one side portion,
c) a pixilated anode electrode array formed on the second major opposing surface, and
d) an electrically insulating material formed on at least said sides of said substrate,
wherein, said side portions of said cathode electrode extend over at least a portion of said insulating material located on at least said sides of said substrate; and
wherein the detector leakage current density is less than 6 nA/mm$^2$ for a bias potential of substantially 1400V and said cathode side portion is a continuous side portion encircling said substrate which comprises cadmium zinc telluride.

* * * * *